(12) United States Patent
Scherer et al.

(10) Patent No.: US 10,011,522 B2
(45) Date of Patent: Jul. 3, 2018

(54) METHOD FOR TREATING ANTIREFLECTION COATINGS ON AN OPTICAL SUBSTRATE, THE THUS OBTAINED OPTICAL SUBSTRATE AND DEVICE FOR CARRYING GOUT SAID METHOD

(75) Inventors: Karin Scherer, St Maur des Fosses (FR); Pascale Lacan, Paris (FR); Richard Bosmans, Noiseau (FR)

(73) Assignee: ESSILOR INTERNATIONAL, Charenton-le-Pont (FR)

( * ) Notice: Subject to any disclaimer, the term of this patent is extended or adjusted under 35 U.S.C. 154(b) by 1486 days.

(21) Appl. No.: 10/569,406

(22) PCT Filed: Sep. 1, 2004

(86) PCT No.: PCT/FR2004/002222
§ 371 (c)(1),
(2), (4) Date: Apr. 27, 2006

(87) PCT Pub. No.: WO2005/024087
PCT Pub. Date: Mar. 17, 2005

(65) Prior Publication Data
US 2006/0257557 A1    Nov. 16, 2006

(30) Foreign Application Priority Data

Sep. 4, 2003 (FR) .................................... 03 10473

(51) Int. Cl.
*C03C 17/00* (2006.01)
*C03C 17/04* (2006.01)
(Continued)

(52) U.S. Cl.
CPC ............ *C03C 17/009* (2013.01); *C23C 14/06* (2013.01); *G02B 1/111* (2013.01); *G02B 1/115* (2013.01); *C03C 2218/15* (2013.01)

(58) Field of Classification Search
CPC ..... B05D 5/06; C03C 17/009; C03C 2218/15; C23C 14/06; G02B 1/111; G02B 1/115
(Continued)

(56) References Cited

U.S. PATENT DOCUMENTS 5,858,519 A * 1/1999 Klinger et al. ............... 428/212
5,882,773 A * 3/1999 Chow et al. .................. 428/212
(Continued)

FOREIGN PATENT DOCUMENTS

EP    1 306 695         5/2003
EP    1306695 A2 *      5/2003    ............... G02B 1/11
(Continued)

OTHER PUBLICATIONS

Chanel et al ("Computation of effective propagation parameters in the optical domain with a finite difference time domain method", Journal of Quantitative Spectroscopy and Radiative Transfer, vol. 100, Issues 1-3, Jul.-Aug. 2006, pp. 77-90, online Dec. 21, 2005.*
(Continued)

*Primary Examiner* — Michael P Wieczorek
*Assistant Examiner* — Michael G Miller
(74) *Attorney, Agent, or Firm* — Young & Thompson

(57) ABSTRACT

Method for treating antireflection coatings on an optical substrate (17) involves a stage for carrying out the physical vacuum-deposit of a fluorinated polymer-containing layer having a low refractive index and is characterized in that the stage includes in deposing a silicium or magnesium fluoride/fluorinated polymer hybrid layer (21d) by simultaneous vacuum evaporation of silicium or magnesium fluoride and the fluorinated polymer, In a preferred embodiment, the fluorinated polymer is embodied in the form of a polymer or tetrafluorethylen polymer and the components are evaporated by a Joule effect or by electron bombardment. The method is advantageously used for improving the adherence
(Continued)

Figure 1:
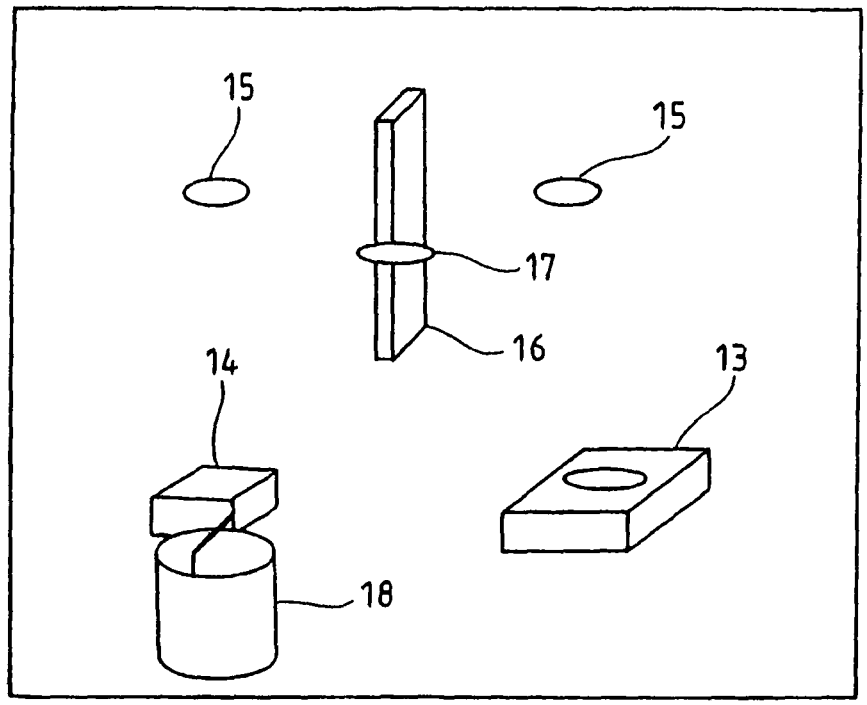

of a low refractive index layer to a subjacent layer of a pile of antireflection coatings which is deposited on any optical substrate or the inventive substrate. The substrate produced by the method and a device for carrying out the method are also disclosed.

14 Claims, 1 Drawing Sheet

(51) Int. Cl.
  *C23C 14/06* (2006.01)
  *G02B 1/111* (2015.01)
  *G02B 1/115* (2015.01)
(58) Field of Classification Search
  USPC .......................................... 427/248.1–255.7
  See application file for complete search history.

(56) References Cited

U.S. PATENT DOCUMENTS

| | | | | |
|---|---|---|---|---|
| 5,948,481 | A | * | 9/1999 | Yan et al. .................. 427/419.3 |
| 6,210,744 | B1 | * | 4/2001 | Hayess et al. ..................... 427/8 |
| 6,235,383 | B1 | | 5/2001 | Han et al. |
| 6,278,809 | B1 | * | 8/2001 | Johnson et al. ................. 385/12 |
| 2002/0187371 | A1 | * | 12/2002 | Nakajima ..................... 428/701 |
| 2005/0250016 | A1 | * | 11/2005 | Takeyama ......................... 430/1 |

FOREIGN PATENT DOCUMENTS

| | | |
|---|---|---|
| JP | 63071801 | 4/1988 |
| JP | 4217203 | 8/1992 |
| JP | 5323103 | 12/1993 |
| JP | 08027573 | 1/1996 |
| JP | 2003202407 | 7/2003 |
| WO | WO 96/21748 | 7/1996 |
| WO | WO 03/056366 | 7/2003 |

OTHER PUBLICATIONS

Chow R et al: "Optical Multilayer Films Based on an Amorphous Fluoropolymer" Journal of Vacuum Science and Technology:, Pat A, American Institute of Physics. New York, US. vol. 14, No. 1, 1996, pp. 63-68, XP000555452, ISSN:0734-2101, cited in the application p. 63, paragraph II.
JP Office Action dated Nov. 30, 2009 from corresponding JP2006-525162.
JP Office Action dated Jul. 5, 2010 from corresponding JP2006-525162.

* cited by examiner

METHOD FOR TREATING ANTIREFLECTION COATINGS ON AN OPTICAL SUBSTRATE, THE THUS OBTAINED OPTICAL SUBSTRATE AND DEVICE FOR CARRYING GOUT SAID METHOD

The present invention consists in a method of producing an antireflection coating on an optical substrate, in particular an ophthalmic lens, by physical vapor-phase deposition (PVD) in a vacuum of at least one antireflection layer containing a fluorinated polymer.

Conventional antireflection treatments consist in a single layer of a material having a low refractive index or, more frequently, alternating thin dielectric layers having high and low refractive indices.

In this respect, it should be noted that obtaining a very low refractive index is particularly beneficial for mass production, as in the case of ophthalmic lenses, because it is preferable to limit the number of layers in the multilayer film to minimize the cycle time of the process and thereby to conform to industrial requirements in terms of cost and service. In the present context, increasing the index difference between the high and low index layers, either by increasing the high index or by reducing the low index, improves the efficacy of antireflection treatments whilst retaining a moderate number of layers.

Apart from functional optical properties, such as a low level of reflection, perfect transparency throughout the visible spectrum and low sensitivity to residual color as a function of the observation angle, for example, the major challenge in developing antireflection multilayer films on an ophthalmic lens is the durability of the treated ophthalmic lenses given the aggressive conditions typical of everyday life. Thus during typical use over a period of two years, a lens may be cleaned one thousand times on average, with more or less suitable cloths, and either dry or using water and detergents. To withstand this aggression without serious harm, it is necessary to obtain excellent adhesion between the multilayer film and the substrate and therefore between the various layers, combined with good resistance to scratching and corrosion.

These requirements apply all the more keenly to the low index material constituting the top or outside layer of the multilayer film, because it is in direct contact with the external environment.

Fluorinated polymers, in particular polymers and copolymers of tetrafluoroethylene, are well known for their low refractive index (generally from 1.35 to 1.4, and equal to 1.35 at 630 nm for polytetrafluoroethylene, for example), and for their ease of cleaning, which makes them particularly attractive as materials for the outside layer of antireflection multilayer films.

"Optical multilayer films based on an amorphous fluoropolymer", J. Vac. Sci. Technol. A14 (1), 63 (1996) 2 R. Chow, G. E. Loomis, R. L. Ward, even refers to an even lower refractive index (1.29 at 630 nm) for Teflon® AF (amorphous Teflon®) deposited by evaporation in a vacuum, i.e. by physical vapor-phase deposition (PVD) in a vacuum.

However, the layers obtained in this way have the drawback of poor adhesion to most materials.

The vacuum evaporation deposition technique nevertheless remains the technique of choice for manufacture on an industrial scale, in particular because of its ease of implementation, combined with the reproducibility and uniformity of the deposits obtained. This is particularly true compared to other techniques, such as plasma-enhanced chemical vapor-phase deposition (PECVD), which is described in international patent application WO 98/33077, for example, and which necessitates the use of costly equipment for the controlled introduction into the treatment enclosure of precursors in gaseous form having complex molecular structures and which are themselves, for all that, generally costly and often toxic. The precursors generally used in PECVD are liquid at room temperature and therefore must be heated outside the treatment enclosure.

A general object of the invention is to provide a simple method of assuring the adhesion of a low refractive index layer including a fluorinated polymer and deposited by evaporation in a vacuum onto an optical substrate or an underlying layer of an anti-reflection multilayer film deposited on that substrate, this method also having other advantages.

To be more precise, the present invention consists in a method for applying an antireflection treatment to an optical substrate including a step of physical vapor-phase deposition (PVD) in a vacuum of a layer having a low refractive index and including a fluorinated polymer and characterized in that said step consists in depositing a hybrid silica ($SiO_2$) or magnesium fluoride ($MgF_2$)/fluorinated polymer layer by simultaneous evaporation in a vacuum of silica or magnesium fluoride and a fluorinated polymer.

This yields a hybrid layer that has a low refractive index, is transparent in the visible spectrum, not only adheres much better than the pure fluorinated polymer evaporated to an optical substrate or an underlying layer deposited beforehand on that substrate, but also has a low refractive index, between the very low refractive index of the fluorinated polymer and the low refractive index of silica (1.48 at 550 nm) or $MgF_2$ (1.38 at 550 nm), and therefore particularly beneficial for the production of thin layers having a low refractive index in an antireflection multilayer film.

The resistance to scratching and to corrosion also remain entirely satisfactory.

In a first embodiment, the silica or magnesium fluoride and fluorinated polymer are co-evaporated so that they are present in constant proportions throughout the thickness of the low index layer, which produces a hybrid layer of homogeneous structure and of constant index throughout the thickness of the layer.

In a second embodiment, when co-evaporating the silica or magnesium fluoride and fluorinated polymer, their proportions are allowed to vary in a controlled manner over the whole of or a portion of the thickness of the low index layer.

The quantity of fluorinated polymer in the low index layer is preferably kept less than or equal to approximately 30% by volume, the remainder consisting of silica or magnesium fluoride, because this achieves the best compromise in terms of adhesion/refractive index/abrasion resistance.

To deposit these compounds in selected proportions throughout the thickness of the low index layer, the method advantageously includes the successive steps of continuously measuring the refractive index of the low index layer being formed or the respective rates of deposition of the silica or magnesium fluoride and fluorinated polymer, determining from said measurements the respective quantities of silica or magnesium fluoride and fluorinated polymer deposited, and regulating the silica or magnesium fluoride and/or fluorinated polymer deposition parameters.

In practice, the rates of deposition may be measured by means of quartz microbalances and the volume concentration of one of the compounds of the hybrid layer may be obtained from the refractive index assuming that a linearized Bruggeman law applies to mixtures of the two compounds.

To optimize the deposition conditions, the silica or the magnesium fluoride and the fluorinated polymer are evaporated by the Joule effect or by means of an electron gun. In practice, the silica or the magnesium fluoride is preferably evaporated by means of an electron gun and the fluorinated polymer is evaporated by means of the Joule effect.

The fluorinated polymer is preferably a polymer or a copolymer of tetrafluoroethylene, in particular an amorphous copolymer of 2,2-bistrifluoromethyl-4,5-difluoro-1,3-dioxole and tetrafluoroethylene.

Teflon® AF 1600 or Teflon® AF 2400 from Dupont de Nemours may be used, for example.

The method of the invention also proves particularly beneficial because it enables the deposition of layers having a low refractive index onto organic material substrates.

Of course, it proves equally beneficial in the situation where the low index layer is deposited as the outside layer of an antireflection multilayer film deposited onto an optical substrate.

A preferred embodiment consists in fabricating an antireflection multilayer film by the successive steps of physical vapor-phase deposition in a vacuum of three layers of the type $ZrO_2/SiO_2/ZrO_2$ and then depositing the low index outside layer.

In practice, each step of physical vapor-phase deposition in a vacuum is effected at a pressure less than or equal to approximately $10^{-2}$ Pa.

The invention also relates to use of the above method to improve the adhesion of a low refractive index layer to the underlying layer of an antireflection multilayer film deposited on an optical substrate or to the optical substrate itself.

It further relates to an optical substrate, in particular an ophthalmic lens, likely to be obtained by the method according to the invention that includes a hybrid layer of silica or magnesium fluoride/fluorinated polymer containing the fluorinated polymer in an amount less than or equal to approximately 30% by volume, the remainder consisting of silica or magnesium fluoride.

The invention finally consists in a device for implementing the method according to the invention, characterized in that it includes:
  a deposition chamber;
  at least two evaporation sources housed in the chamber, each designed to bring about the evaporation of a material to be deposited by physical vapor-phase deposition in a vacuum and adapted to be able to deposit a hybrid layer;
  a substrate carrier housed in the chamber; and
  a pumping system for establishing a vacuum in the chamber.

According to preferred features of the above device:
  means are provided for continuously determining the quantity of each material deposited connected by a control loop to the evaporation sources; and/or
  the determination means include two quartz microbalances each associated with one of the evaporation sources; and/or
  the evaporation sources include at least one Joule effect evaporation source and one electron gun; and/or
  a cold trap is provided to increase the water pumping rate.

Figure 2:
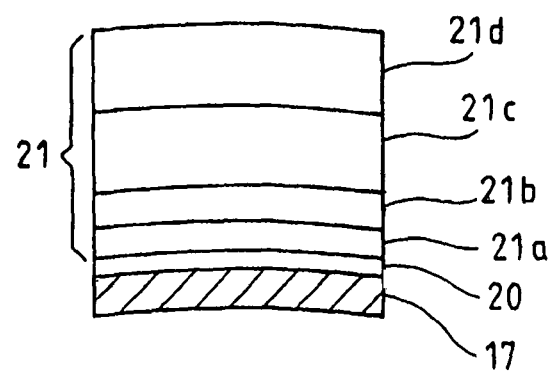

The features and advantages of the invention emerge from the following description given by way of example and with reference to the appended diagrammatic drawings, in which:

FIG. 1 is a diagram of the configuration of a device for implementing the method of the invention; and FIG. 2 represents an antireflection multilayer film obtained using a preferred embodiment of the invention.

In the embodiment shown, the device 10 for implementing the antireflection treatment method of the invention takes the form of a Leybold Heraeus 700 QE evaporation machine consisting of a frame 11 defining a deposition chamber 12.

A pumping system (not shown in FIG. 1 for simplicity) is also provided to establish a vacuum inside the deposition chamber 12. A cold trap (Meissner trap), also not shown in FIG. 1 for simplicity, is also disposed inside the machine 10 to increase the water pumping rate. It is therefore possible to reduce the pressure from atmospheric pressure to the treatment pressure (which in practice is of the order of $10^{-2}$ Pa) in a few minutes.

The machine 10 is also equipped with a Leybold ESV 6 electron gun 13 with a rotary crucible with four cavities and a Joule effect evaporation source 14.

Two quartz microbalances 15 separated by a mask 16 measure and control the rates of deposition. To this end they are connected to the evaporation sources by a control loop.

Control of the composition of a layer deposited is based, to a first approximation, on the ratio of the two set rates of deposition.

A conventional turntable, also not shown for simplicity, serves as a substrate-carrier within the chamber 12.

In the embodiment shown, only one substrate 17 can be seen.

An ion gun 18, for example a Commonwealth Mark II ion gun, is also disposed inside the deposition chamber 12 to carry out initial cleaning of the substrate 17 before deposition of the first antireflection thin layer.

FIG. 2 shows one example of a multilayer film that can be obtained by the method of the invention.

In the embodiment shown in this figure, an organic substrate 17, here of CR39 coated with commercially available anti-abrasion varnish (ORMA SUPRA®) is coated with an antireflection multilayer film 21 comprising alternating thin layers 21a-21d with high and low refractive indices.

In the preferred embodiment shown in FIG. 2, the material of the first layer 21a has a high refractive index (i.e. a refractive index greater than 1.6). Here this material is zirconium oxide ($ZrO_2$) and is typically deposited to a physical thickness from 10 to 40 nm.

The second layer 21b deposited on the first layer 21a here consists of silica ($SiO_2$), which has a low refractive index, and typically has a thickness from 10 to 55 nm.

The third layer 21c deposited is identical here to the first layer 21a ($ZrO_2$ layer), except for the thickness, which is from 30 to 200 nm, and preferably from 120 to 150 nm.

The above three layers are deposited successively by evaporation in a vacuum using the machine 10 shown in FIG. 1.

In other embodiments, the materials constituting the three anti-reflection layers 21a-21c and those constituting the substrate 17 or the anti-abrasion varnish 20 may be replaced by other equivalent materials well known to the person skilled in the art.

According to the invention, the antireflection multilayer film 21 further includes a hybrid outside layer 21d from 70 to 110 nm thick having a low refractive index.

In the preferred embodiment, this hybrid layer is formed of a mixture of silica ($SiO_2$) and an amorphous copolymer of 2,2-bistrifluoromethyl-4,5,difluoro-1,3-dioxole and tetrafluoroethylene, commercially available as Teflon® AF 1600 or Teflon® AF 2400. These amorphous fluorinated copolymers are soluble in perfluorinated solvents and their structural formula is as follows (the ratio b:a, i.e. the dioxole/tetrafluoroethylene ratio, is 2 for AF 1600 and 4.56 for AF 2400):

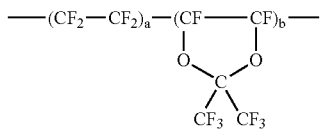

The above compounds are deposited by co-evaporation in a vacuum (physical vapor-phase deposition in a vacuum) using the machine 10 shown in FIG. 1 so that they are present in constant proportions throughout the thickness of the low index layer 21d.

In practice, the silica is evaporated by the electron gun 13 and the amorphous copolymer is evaporated by means of the Joule effect by the Joule effect evaporation source 14.

Conventionally, an anti-soiling layer is further deposited onto a multilayer film of the above kind.

In the case of the present invention, the deposition of a layer of this kind is no longer essential in that the hybrid outside layer already provides this anti-soiling function.

Moreover, the volume concentration of amorphous fluorinated copolymer in the hybrid layer 21d is kept around 30% in this preferred embodiment.

In this regard, it should be pointed out that Teflon® AF 2400 is liquefied by the Joule effect evaporation source 14 before it is evaporated by the same source.

Moreover, as already stated hereinabove, in other embodiments the silica may be replaced by magnesium fluoride (MgF$_2$) and the amorphous fluorinated copolymer referred to above may be replaced by polytetrafluoroethylene in particular. In a preferred embodiment, these amorphous fluorinated copolymers may be replaced by Teflon® MP 1600 taking the form of microparticles with an average size of 0.2 mm.

In a first example, the hybrid layer was obtained by co-evaporation of silica and polytetrafluoroethylene (Teflon® MP 1600) with a constant proportion of Teflon® equal to 30%.

The substrate 17 obtained in the above manner was subjected to the N×10 blows test described in the international patent application WO 99/49097. That test loads the adhesion of the thin layers deposited onto an organic substrate. It has been found that the multilayer film 21 has good adhesion properties and in particular that the hybrid layer 21d adheres in an entirely satisfactory manner to the underlying ZrO$_2$ layer.

The substrate 17 was also subjected to the "steel wool" test, whereby five two-way strokes with extra fine steel wool are carried out on a coated substrate in order to assess the resistance to scratching thereof. This test also showed that the antireflection multilayer film 21 had entirely satisfactory resistance to scratching. Furthermore, measuring the refractive index of the hybrid layer reveals a highly beneficial value of 1.42 at a wavelength of 630 nm. It will also be appreciated that the hybrid layer 21d obtained by the method of the invention has a homogeneous structure, is of constant refractive index throughout its thickness, and is perfectly transparent in the visible spectrum.

In a second example, by controlling the rates of deposition, a hybrid layer is obtained whose index varies in linear fashion from 1.46 to 1.33 from the substrate toward the surface, corresponding to volume proportions of Teflon® from zero to around 80%.

More generally, it has been proved that the method of the invention produces antireflection multilayer films having thin layers with highly satisfactory characteristics from the points of view of adhesion, resistance to scratching, corrosion resistance and ease of cleaning.

Of course, the present invention is not limited to the embodiment described and shown, and encompasses any variant execution thereof.

The invention claimed is:

1. A method for applying an antireflection treatment to an optical substrate, comprising:
    depositing by physical vapor-phase deposition (PVD) in a vacuum a low index layer having a low refractive index and including a fluorinated polymer,
    wherein said depositing step consists in depositing a hybrid silica (SiO$_2$) or magnesium fluoride (MgF$_2$)/fluorinated polymer layer as said low index layer by a simultaneous co-evaporation, in a vacuum, of the silica or magnesium fluoride and the fluorinated polymer, the fluorinated polymer being a homopolymer of tetrafluoroethylene.

2. The method according to claim 1, wherein the silica or magnesium fluoride and the fluorinated polymer are co-evaporated so that the silica or magnesium fluoride and the fluorinated polymer are present in constant proportions throughout a thickness of the low index layer.

3. The method according to claim 2, wherein a quantity of the fluorinated polymer in the low index layer is kept less than or equal to approximately 30% by volume, and a remaining quantity in the low index layer consists of the silica or magnesium fluoride.

4. The method according to claim 2, further comprising successive steps of:
    continuously measuring, as measurements, one of i) a refractive index of the low index layer as the low index layer is formed and ii) respective rates of deposition of the silica or magnesium fluoride and the fluorinated polymer;
    determining from said measurements respective quantities of deposited silica or magnesium fluoride and deposited fluorinated polymer; and
    regulating deposition parameters of the silica or magnesium fluoride and/or the fluorinated polymer in order to deposit the silica or magnesium fluoride and the fluorinated polymer in selected proportions throughout the thickness of the low index layer.

5. The method according to claim 1, wherein, when co-evaporating the silica or magnesium fluoride and the fluorinated polymer, proportions of the silica or magnesium fluoride and the fluorinated polymer are allowed to vary in a controlled manner over a whole of or a portion of the thickness of the low index layer.

6. The method according to claim 5, wherein a quantity of fluorinated polymer in the low index layer is from zero to approximately 80% by volume in a direction from the substrate toward a surface of the low index layer, and a remaining quantity in the low index layer consists of the silica or magnesium fluoride.

7. The method according to claim 1, wherein the silica or magnesium fluoride and fluorinated polymer are evaporated by means of the Joule effect or by means of an electron gun.

8. The method according to claim 1, wherein the silica or magnesium fluoride is evaporated by means of an electron gun and the fluorinated polymer is evaporated by means of the Joule effect.

9. The method according to claim 1, wherein the substrate is an organic material substrate.

10. The method according to claim 1, wherein the low index layer is an outside layer of an antireflection multilayer film deposited on the optical substrate.

11. The method according to claim 10, wherein the antireflection multilayer film is fabricated by successive steps of physical vapor-phase deposition (PVD) in a vacuum of three layers of the type $ZrO_2/SiO_2/ZrO_2$, and then said deposition of the low index layer as the outside layer.

12. The method according to claim 11, wherein each successive step of physical vapor-phase deposition is effected at a pressure less than or equal to approximately $10^{-2}$ Pa.

13. A method for applying an antireflection treatment to an optical substrate, comprising:
depositing by physical vapor-phase deposition (PVD) in a vacuum a low index layer having a low refractive index and including a fluorinated polymer,
wherein said depositing step consists in depositing a hybrid silica ($SiO_2$)/fluorinated polymer layer as said low index layer by a simultaneous co-evaporation, in a vacuum, of the silica and the fluorinated polymer, the fluorinated polymer being a homopolymer of tetrafluoroethylene.

14. A method for applying an antireflection treatment to an optical substrate, comprising:
depositing by physical vapor-phase deposition (PVD) in a vacuum a low index layer having a low refractive index and including a fluorinated polymer,
wherein said depositing step consists in depositing a hybrid magnesium fluoride ($MgF_2$)/fluorinated polymer layer as said low index layer by a simultaneous co-evaporation, in a vacuum, of the magnesium fluoride and the fluorinated polymer, the fluorinated polymer being a homopolymer of tetrafluoroethylene.

* * * * *